(12) United States Patent
Kitabata et al.

(10) Patent No.: US 8,681,460 B2
(45) Date of Patent: Mar. 25, 2014

(54) ELECTROSTATIC DISCHARGE (ESD) PROTECTION DEVICE

(75) Inventors: Goh Kitabata, Kanagawa (JP); Minato Harada, Tokyo (JP)

(73) Assignees: Sony Corporation, Tokyo (JP); Sony Mobile Communications Inc., Tokyo (JP)

( * ) Notice: Subject to any disclaimer, the term of this patent is extended or adjusted under 35 U.S.C. 154(b) by 69 days.

(21) Appl. No.: 13/404,479

(22) Filed: Feb. 24, 2012

(65) Prior Publication Data

US 2013/0016447 A1 Jan. 17, 2013

Related U.S. Application Data

(60) Provisional application No. 61/507,260, filed on Jul. 13, 2011.

(51) Int. Cl.
*H02H 3/22* (2006.01)

(52) U.S. Cl.
USPC ............................................ 361/56; 361/111

(58) Field of Classification Search
USPC .............................................. 361/56, 111, 91.1
See application file for complete search history.

(56) References Cited

U.S. PATENT DOCUMENTS

| | | | | |
|---|---|---|---|---|
| 6,009,314 A | * | 12/1999 | Bjork et al. | 455/83 |
| 6,347,146 B1 | * | 2/2002 | Short et al. | 381/15 |
| 2012/0113553 A1 | * | 5/2012 | Dupuis | 361/56 |

* cited by examiner

*Primary Examiner* — Danny Nguyen

(74) *Attorney, Agent, or Firm* — Oblon, Spivak, McClelland, Maier & Neustadt, L.L.P.

(57) ABSTRACT

An electrostatic discharge (ESD) protection device that protects a power amplifier from ESD. The ESD protection device includes a filter circuit connected to an antenna line of a wireless communication apparatus and that passes an ESD component having a predetermined frequency or less, a detection circuit that converts an output of the filter circuit into an analog DC output, a level determination circuit that detects that the analog DC output of the detection circuit is a predetermined threshold value or more, and a control interrupt circuit that controls a state of the power amplifier in accordance with an output of the level determination circuit.

20 Claims, 12 Drawing Sheets

US 8,681,460 B2

ELECTROSTATIC DISCHARGE (ESD) PROTECTION DEVICE

CROSS REFERENCE TO RELATED APPLICATION

The present application claims the benefit of the earlier filing date of U.S. Provisional Patent Application Ser. No. 61/507,260 filed on Jul. 13, 2011, the entire contents of which is incorporated herein by reference.

BACKGROUND OF THE DISCLOSURE

1. Field of the Disclosure

The present disclosure relates to a wireless communication apparatus, and in particular to an ESD protection device that protects a power amplifier used in a wireless communication apparatus, and specifically in a transmission circuit thereof, from electrostatic discharge (ESD).

2. Description of Related Art

Semiconductor devices used in a variety of electronic devices are known to operate erroneously or be broken because of noise (ESD noise) due to electrostatic discharge occurring inside or outside the electronic device.

In wireless communication apparatuses having an antenna, such as cellular phone terminals which have become widespread in recent years, in particular, ESD noise may be picked up by the antenna or an antenna line (antenna path) to significantly affect semiconductor devices forming a power amplifier connected to the antenna.

As measures against ESD, the following methods are used in the related art.

a) Voltage limiting elements such as a varistor, a Zener diode, and a suppressor are disposed for input and output pins of the semiconductor devices to protect the semiconductor devices by cutting off a high voltage due to ESD by causing such a voltage to bypass the semiconductor devices in the case where an overvoltage such as ESD noise is applied.

b) An inductor (shunt L) or the like is provided to connect the antenna line to GND to cause a DC component to flow to GND by bypassing the semiconductor devices, or a capacitor (series C) or the like is connected in series with the antenna line to prevent a DC component from passing through the semiconductor devices.

The above method a) may be effective measures against a high voltage that may cause a device breakage. However, the impedance of the antenna line may be varied in accordance with the electrical state around the antenna, which may cut off a voltage for a transmission output to result in distortion in transmission output. In particular, the antenna impedance of the cellular phone terminals is significantly variable because of inconstant environments, and is highly likely to be problematic.

Of the method b), the method in which the antenna line is connected to GND in terms of DC using the shunt L can effectively eliminate the effect of ESD noise at a frequency that is sufficiently low with respect to the transmission/reception frequency. However, ESD noise is distributed over a significantly wide frequency domain, and thus the effect of ESD noise cannot be completely eliminated.

Likewise, the method in which the antenna line is separated from the semiconductor devices in terms of DC using the series C can effectively eliminate the effect of ESD noise at a frequency that is sufficiently low with respect to the transmission/reception frequency.

However, ESD noise is distributed over a significantly wide frequency domain, and therefore the effect of ESD noise cannot be completely eliminated by the methods according to the related art discussed above.

In recent years, in particular, tolerance to ESD noise has been decreasing along with miniaturization of integrated circuits and size and weight reduction of devices, and there is an increasing need for more effective ESD measures.

SUMMARY OF THE DISCLOSURE

Against such background, the inventor recognizes the need for an ESD protection device with a novel configuration that allows to effectively eliminate the effect of ESD in a wireless communication apparatus.

According to a first embodiment, the disclosure is directed to an electrostatic discharge (ESD) protection device that protects a power amplifier from ESD. The ESD protection device includes a filter circuit connected to an antenna line of a wireless communication apparatus and that passes an ESD component having a predetermined frequency or less, a detection circuit that converts an output of the filter circuit into an analog DC output, a level determination circuit that detects that the analog DC output of the detection circuit is a predetermined threshold value or more, and a control interrupt circuit that controls a state of the power amplifier in accordance with an output of the level determination circuit.

According to another exemplary embodiment, the disclosure is directed to a method performed by an electrostatic discharge (ESD) protection device of protecting a power amplifier, the method comprising: converting an output of a filter that is connected to an antenna line of a wireless communication apparatus and that passes an ESD component having a predetermined frequency or less into an analog DC output; detecting that the analog DC output meets or exceeds a predetermined threshold; and controlling a state of the power amplifier based on a result of the detecting.

According to another exemplary embodiment, the disclosure is directed to an electrostatic discharge (ESD) protection device that protects a power amplifier from ESD. The ESD protection device includes a first path switching circuit connected to an antenna line of a wireless communication apparatus, a second path switching circuit connected to the power amplifier, a first matching circuit having a first impedance connected between the first path switching circuit and the power amplifier, a second matching circuit having a second impedance connected between the first path switching circuit and the power amplifier, a filter circuit connected to the antenna line and that passes an ESD component having a predetermined frequency or less, a detection circuit that converts an output of the filter circuit into an analog DC output; and a control interrupt circuit that controls the switching circuits to switch between the first and second matching circuits based on an output of the detection circuit.

According to the ESD protection device, the power amplifier can be protected without affecting the RF (radio frequency) characteristics. In particular, the power amplifier can be protected by detecting ESD noise while maintaining a low loss and low distortion, providing measures that may be effective even under conditions where protection cannot be provided by the techniques according to the related art.

DETAILED DESCRIPTION

A preferred embodiment of the present disclosure will be described in detail below with reference to the drawings.

Figure 1:
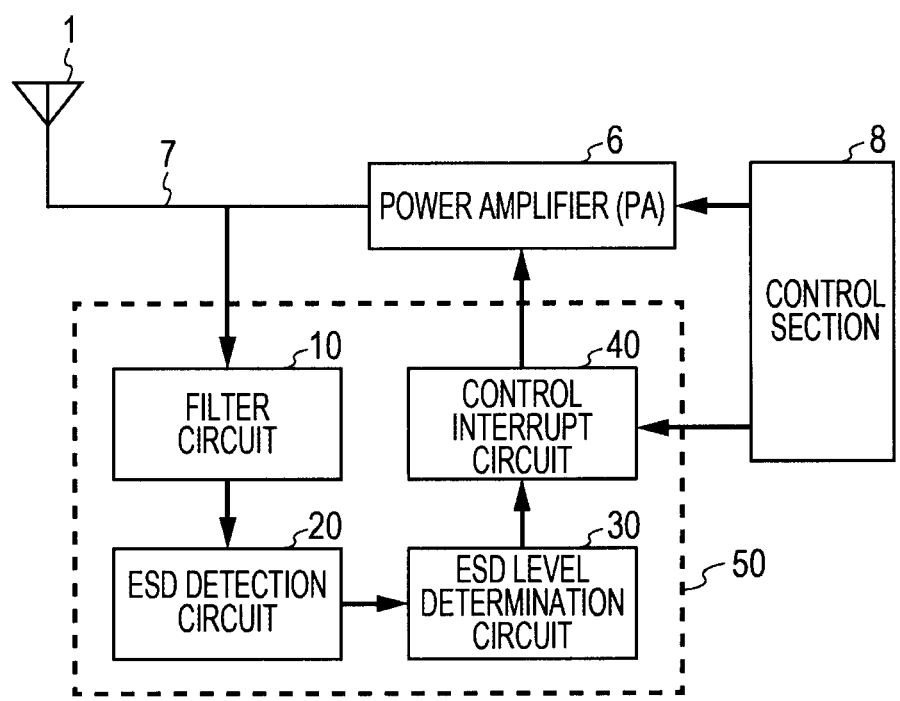
FIG. 1 is a block diagram showing a schematic configuration of a portion of a wireless communication apparatus including an ESD protection device according to an embodiment of the present disclosure.

FIG. 1 shows a schematic configuration of a portion of a wireless communication apparatus including an ESD protection device 50 according to the embodiment.

The ESD protection device 50 is connected to a path for an antenna 1 (antenna line) connected to a power amplifier (PA) 6. The ESD protection device 50 controls the power amplifier 6 in accordance with generation of ESD under control by a control section 8.

More specifically, the ESD protection device 50 is formed by a filter circuit 10, an ESD detection circuit 20, an ESD level determination circuit 30, and a control interrupt circuit 40.

Figure 2:
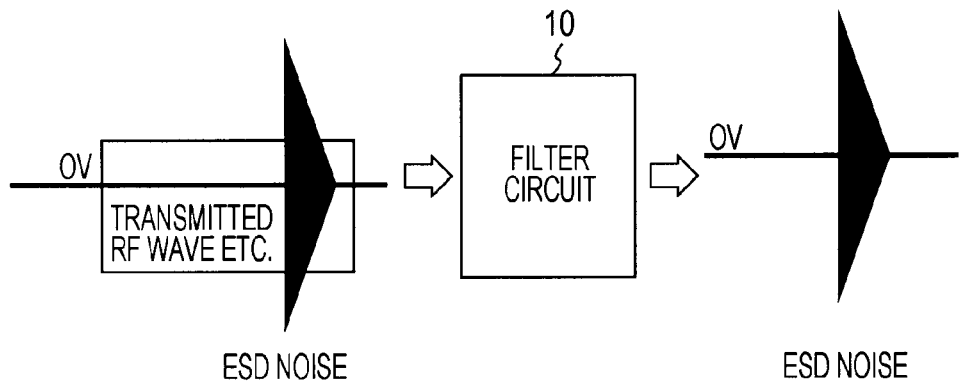
FIG. 2 schematically shows how a filter circuit shown in FIG. 1 works.

The effect of ESD on the power amplifier 6 is considered to be ascribable to the fact that electric power at a frequency that is relatively lower than the frequency used in the wireless communication apparatus flows back to the power amplifier 6 in the case where ESD noise is applied to an antenna line 7 (the antenna or antenna GND, or a path therebetween). Thus, in order to achieve a low loss for the frequency of use of the wireless communication apparatus, the ESD protection device 50 is characterized to be open to the antenna line 7. In order to prevent the ESD protection device from erroneously detecting a transmitted wave as ESD, on the other hand, a sufficient attenuation is secured for the transmission frequency while achieving a low loss for a domain of several hundred MHz or less which may contain an ESD component. For this purpose, the filter circuit 10 is connected to the antenna line 7, and blocks a transmitted RF wave etc. and transmits an ESD component at a predetermined frequency or less. FIG. 2 schematically shows how the filter circuit 10 works (that is, the relationship between input and output).

Figure 3:
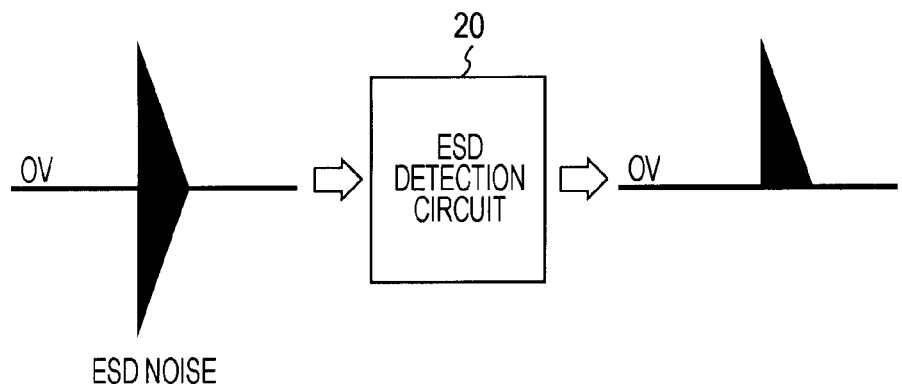
FIG. 3 schematically shows how an ESD detection circuit shown in FIG. 1 works.

The ESD detection circuit 20 is a circuit that converts an output of the filter circuit 10 into an analog DC output. The ESD detection circuit 20 uses a wave detection circuit for full-wave rectification to detect both positive and negative inputs. The time constant of the ESD detection circuit 20 is set to provide a sufficient detection sensitivity for an ESD input. FIG. 3 schematically shows how the ESD detection circuit 20 works (that is, the relationship between input and output).

Figure 4:
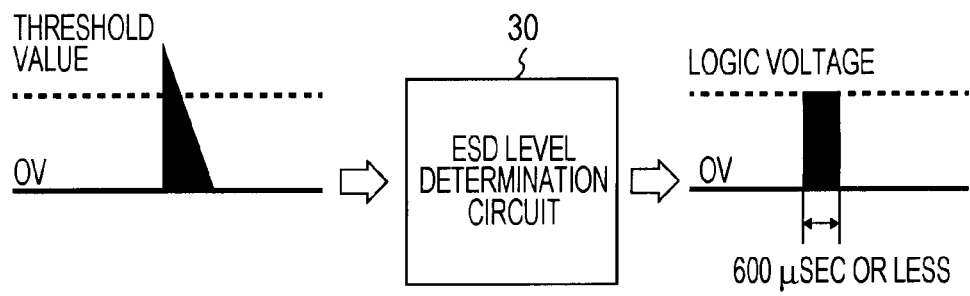
FIG. 4 schematically shows how an ESD level determination circuit shown in FIG. 1 works.

The ESD level determination circuit 30 is a circuit that detects that the analog DC output of the ESD detection circuit 20 has become a predetermined threshold value or more. FIG. 4 schematically shows how the ESD level determination circuit 30 works (that is, the relationship between input and output). When the analog DC output of the ESD detection circuit 20 has become the predetermined threshold value or more, the ESD level determination circuit 30 outputs a pulse with a predetermined pulse width and at a predetermined logic voltage. In the embodiment, the pulse width is set to 600 μsec or less to prevent disconnection of communication due to de-energization of the power amplifier 6. In the embodiment, in order to prevent erroneous detection of ESD due to NFC (Near Field Communication) by a wireless tag etc. or a broadcast wave, the ESD level determination circuit 30 has a function of canceling a stationary input by electric power from a wireless output that is irrelevant to ESD, of detection outputs of the ESD detection circuit 20. This will be discussed in detail later.

The control interrupt circuit 40 interrupts normal control for the power amplifier 6 in accordance with an output of the ESD level determination circuit 30 to control the state of the power amplifier 6. That is, during normal operation, the control interrupt circuit 40 does not affect the wireless function. When predetermined ESD is detected, however, the control interrupt circuit 40 interrupts power supply control or the like for the power amplifier 6 to disable the output of the power amplifier 6, that is, to block the power supply to the power amplifier 6. Instead, the output of the control interrupt circuit 40 may be connected to a gain control terminal (not shown) of the power amplifier 6 so that the gain of the power amplifier 6 can be reduced by a predetermined amount (for example, about 10 dB) to reduce the output of the power amplifier 6 when predetermined ESD is detected. An erroneous operation and a breakage of the power amplifier 6 can be prevented by blocking the power supply voltage, reducing the gain, or the like.

Figure 5:
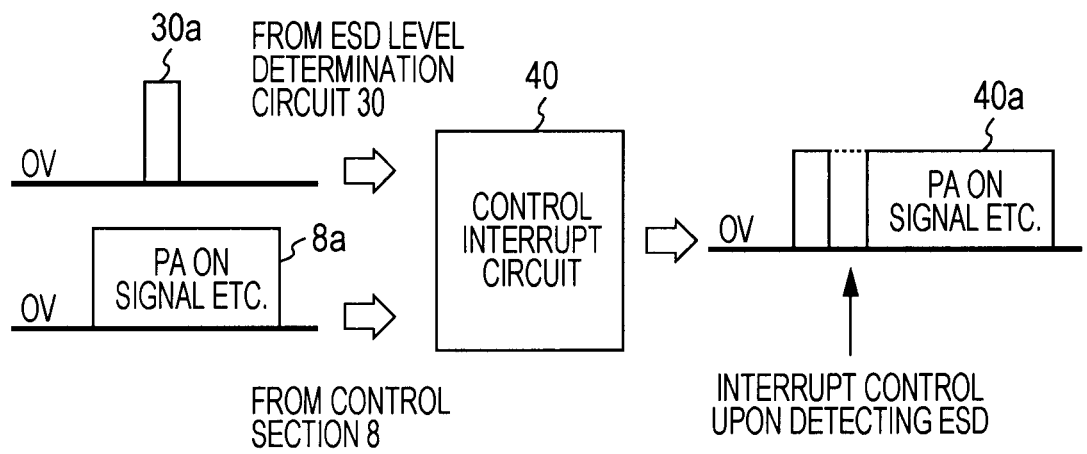
FIG. 5 schematically shows how a control interrupt circuit shown in FIG. 1 works.

FIG. 5 schematically shows how the control interrupt circuit 40 works (that is, the relationship between input and output). That is, the control interrupt circuit 40 receives a PA drive signal 8a for turning ON the power amplifier 6 from the control section 8 and a pulse signal 30a from the ESD level determination circuit 30, and outputs a PA drive signal 40a for blocking the power supply voltage for the power amplifier 6, or for reducing the gain of the power amplifier 6, at a timing and with a width corresponding to the pulse signal 30a.

The reason for using the antenna line 7 to detect ESD will be described.

It has been experimentally found that ESD applied from outside a housing of the wireless communication apparatus is applied to the power amplifier 6 through the antenna line 7 to cause a critical problem such as a breakage. It is considered that ESD can be detected not only at a power feed element of the antenna but also at a metal portion of the housing forming a part of antenna GND. The term "antenna line" is used herein to include such a meaning.

Figure 6:
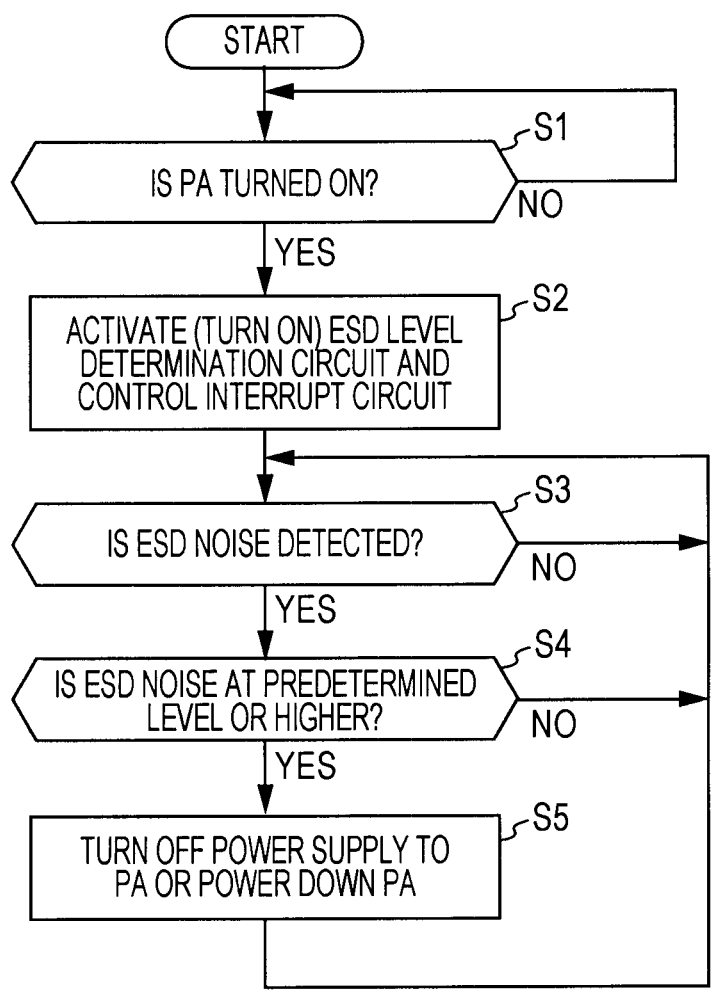
FIG. 6 is a flowchart illustrating a typical operation of the ESD protection device shown in FIG. 1.

A typical operation of the ESD protection device 50 shown in FIG. 1 will be described with reference to the flowchart of FIG. 6.

S1: The control section 8 turns ON the power amplifier (PA) 6. In the case where the power amplifier 6 to be protected is not turned ON, the process does not proceed to the subsequent steps. When the operation of the power amplifier 6 is not required, the ESD protection device 50 can be turned OFF to minimize power consumption.

S2: At the same time as the power amplifier 6 to be protected is turned ON, the control section 8 turns ON the ESD level determination circuit 30 and the control interrupt circuit 40. The ESD detection circuit 20 is formed by a passive circuit, and is in an operable state at all times.

S3: ESD noise in a such range that may generally occur during normal use of the wireless communication apparatus is applied to the wireless communication apparatus. ESD noise in the assumed range may be generated in the case where a user touches the wireless communication apparatus with the wireless communication apparatus electrically charged, or in the case where a user touches the wireless communication apparatus with his/her hand electrically charged. When ESD noise is generated in such a state of use, electric power corresponding to the voltage of the ESD noise is generated in the antenna line 7. The filter circuit 10 removes electric power from a wireless output that is irrelevant to ESD to extract electric power due to ESD. The ESD detection circuit 20 converts the extracted electric power into an analog DC voltage.

S4: The ESD level determination circuit 30 compares the thus obtained detection analog DC voltage with a preset reference voltage (threshold value) to check whether the detection analog DC voltage indicates ESD noise at a predetermined level or higher. The control interrupt circuit 40 is allowed to operate only in the case where the detection analog DC voltage is the predetermined threshold value or more. In an experiment on a cellular phone terminal that uses a GSM linear PA, the power amplifier was broken at 6 kV. Thus, the embodiment aims to detect the ESD level at 6 kV. That is, the threshold value for ESD level determination is set to 6 kV.

S5: The control interrupt circuit 40 directly or indirectly controls the power amplifier 6 when an output of the ESD level determination circuit 30 exceeds the threshold value. This provides an operation for protecting the power amplifier 6 to be protected from ESD.

As a first operation for directly controlling the power amplifier 6, it is conceivable to turn OFF the power amplifier 6 (turn off the power supply voltage). The OFF period is set to be equal to or less than about 600 μsec, which is within one burst in GSM, for example. Such an OFF period is provided to prevent discontinuation of a call connection for communication even when the ESD protection function is enabled.

As a second operation for directly controlling the power amplifier 6, it is conceivable to reduce the output of the power amplifier 6. To this end, the gain of the power amplifier 6 is reduced.

The power amplifier 6 may be broken at different ESD levels depending on the device incorporating the power amplifier 6. Thus, in the case where the power amplifier 6 is applied to actual products, it is desirable to optimize the above threshold value for each of individual wireless communication apparatuses.

An operation for indirectly controlling the power amplifier 6 will be discussed later in relation to a second embodiment.

Figure 7:
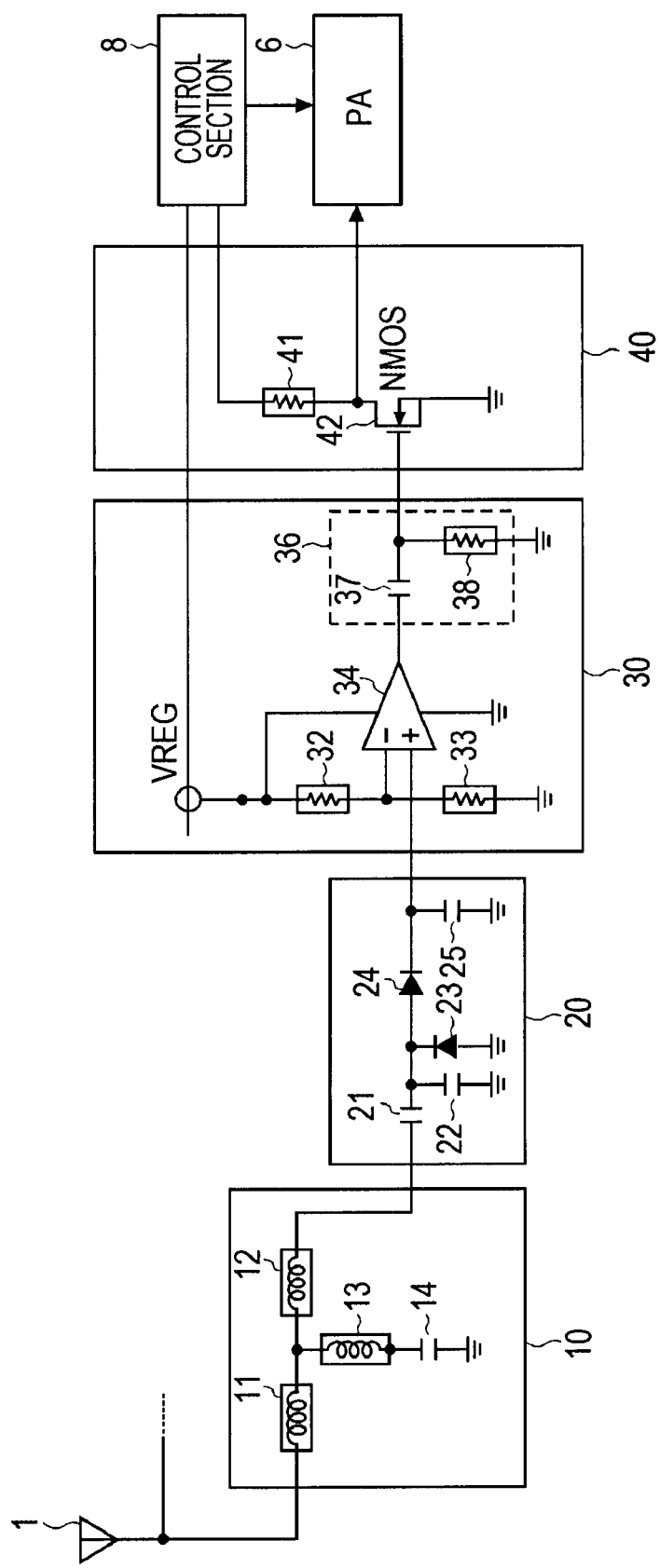
FIG. 7 shows a specific circuit configuration of the ESD protection device according to the embodiment of the present disclosure.

FIG. 7 shows a specific circuit configuration of the ESD protection device 50 according to the embodiment.

In this example, the filter circuit 10 is a T-type filter circuit formed by two inductors 11 and 12 connected in series between the antenna 1 and the ESD detection circuit 20, and an inductor 13 and a capacitor 14 connected in series between the connection point between the inductors 11 and 12 and GND. It should be noted, however, that the elements forming the filter circuit 10 and the type of the filter circuit 10 are not limited to those shown.

The ESD detection circuit 20 is formed by capacitors 21, 22, and 25 and diodes 23 and 24. One end of the capacitor 21 is connected to the output end of the filter circuit 10. The other end of the capacitor 21 is connected to the anode of the diode 24. The cathode of the diode 24 is connected to the input end of the ESD level determination circuit 30. The capacitor 22 is connected between the connection point between the capacitor 21 and the diode 24 and GND. The diode 23 is connected in parallel with the capacitor 22 with the anode on the GND side. The capacitor 25 is connected between the cathode side of the diode 24 and GND. The thus configured ESD detection circuit 20 forms a full-wave rectifier circuit.

The ESD level determination circuit 30 is formed by a comparator 34, resistors 32 and 33, a capacitor 37, and a resistor 38. The resistors 32 and 33 are connected between a power supply voltage VREG and GND to generate the reference voltage at an intermediate point between the resistors 32 and 33. The comparator 34 compares the reference voltage and the output voltage of the ESD detection circuit 20 to output comparison results. In this example, the comparator 34 generates an output voltage that varies from a low level to a high level when the output voltage of the ESD detection circuit 20 exceeds the reference voltage. The capacitor 37 and the resistor 38 form a differentiating circuit 36 that detects variations in voltage input to the differentiating circuit 36. The differentiating circuit 36 outputs a pulse with a predetermined pulse width when the output voltage of the comparator 34 varies from the low level to the high level. The stationary input discussed above can thus be canceled. The pulse width is determined by the time constant of the differentiating circuit 36.

The control interrupt circuit 40 is formed by a field-effect transistor (FET) 42 which serves as a switching element and the source of which is grounded, and a load resistor 41 connected to the drain of the FET 42. In this example, an NMOS-type FET is used as the FET 42. However, the switching element is not limited thereto. The output of the ESD level determination circuit 30 is applied to the gate of the FET 42. Upon receiving the pulse output from the ESD level determination circuit 30, the thus configured control interrupt circuit 40 generates a pulse output that turns ON for a predetermined period at the drain terminal to output the generated pulse output as a control signal for the power amplifier 6.

The control section 8 activates the power amplifier 6, the ESD level determination circuit 30, and the control interrupt circuit 40 by supplying operating power to the respective components during an operation of the power amplifier 6. It should be noted, however, that the power supply voltage for the power amplifier 6 is blocked, or the gain of the power amplifier 6 is reduced, for a predetermined period in accordance with the output of the ESD level determination circuit 30 when predetermined ESD is generated as discussed above.

Now, the effect of the embodiment will be described in comparison with that of the related art.

Figure 8:
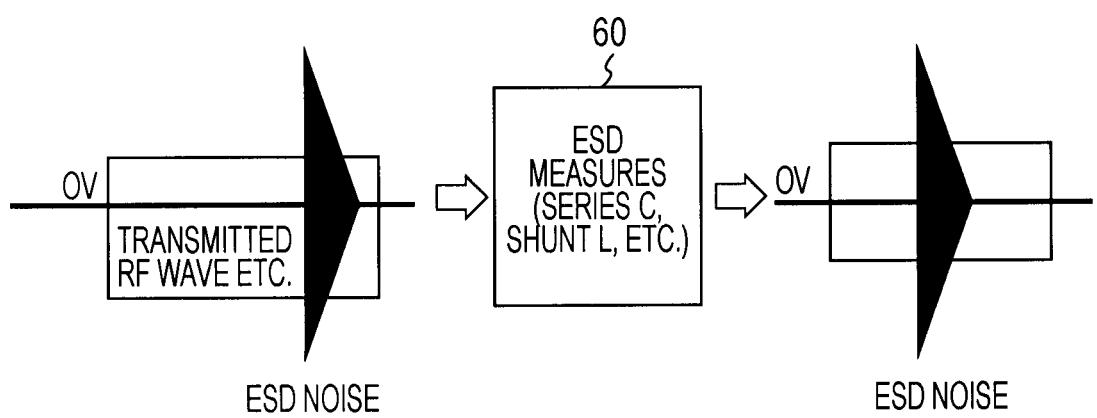
FIG. 8 illustrates the effect of ESD measures that use a series C, a shunt L, or the like according to the related art.

FIG. 8 illustrates the effect of ESD measures that use a series C, a shunt L, or the like according to the related art. As schematically shown in the drawing, noise due to ESD carried by a transmitted RF wave or the like can be reduced, but cannot be completely removed, by ESD measures 60.

Figure 9A:
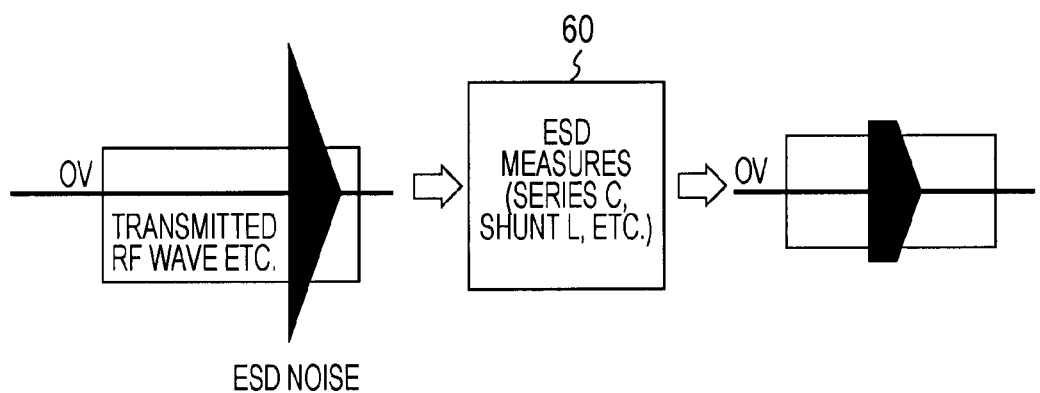
FIGS. 9(A) and 9(B) illustrate the effect of ESD measures that use a varistor or the like according to the related art.
Figure 9B:
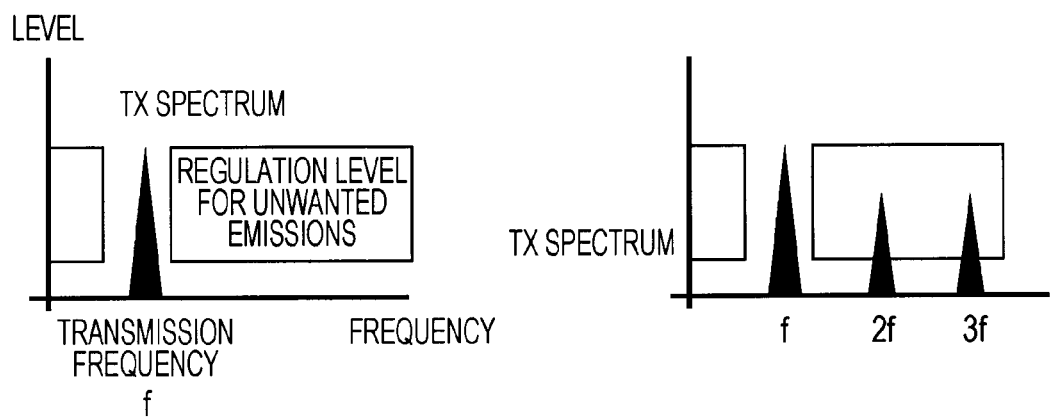

FIG. 9 illustrates the effect of ESD measures that use a varistor or the like according to the related art. According to this technology, as schematically shown in FIG. 9(A), a noise voltage due to ESD can be reduced. However, as shown in FIG. 9(B), unwanted emissions at twice or three times the transmission frequency are generated by distortion generated by the varistor or the like, and hinders meeting the specifications of communication systems for various countries.

Figure 10:
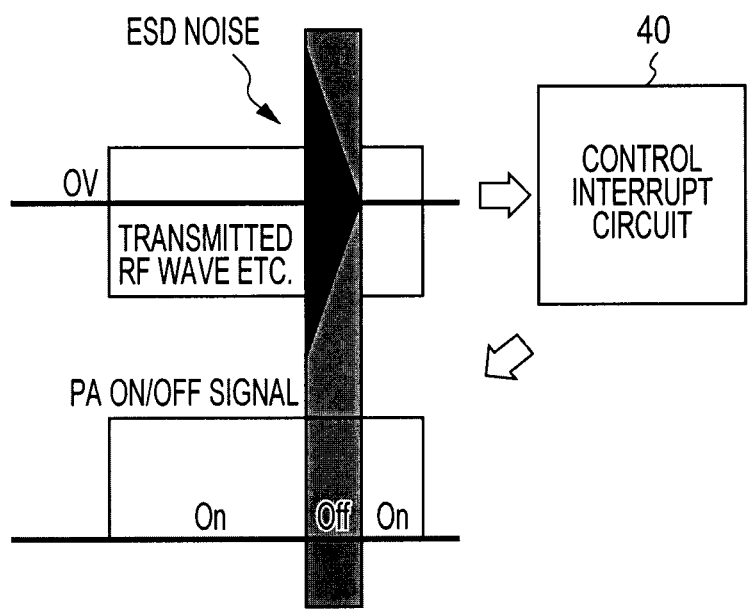
FIG. 10 illustrates the effect of the embodiment of the present disclosure.

In contrast, according to the embodiment, as shown in FIG. 10, the effect of ESD noise (for example, a breakage of a semiconductor device) can be effectively prevented by turning off the power amplifier when predetermined ESD is detected. A breakage of a semiconductor device is caused by an abnormal current flowing through a transistor when ESD noise is input while the semiconductor device is operating to produce a large output. Thus, the effect of ESD can be avoided by blocking the power supply to the power amplifier 6, or reducing the gain of the power amplifier 6, at the timing when such ESD noise is generated. Because the power supply is blocked, or the gain is reduced, for a short period, the operation of the power amplifier, and hence of the wireless communication apparatus, is not substantially adversely affected.

Next, a second embodiment of the present disclosure will be described. In the embodiment discussed above, the state of the power amplifier 6 is directly controlled to avoid the effect of ESD on the power amplifier 6 when predetermined ESD is detected. However, the output of the power amplifier 6 is considered to travel through a path for a load that is resistance to ESD that is used temporarily when ESD noise is applied, besides a path with excellent RF characteristics that is used at all times. Thus, it is also conceivable to indirectly control the state of the power amplifier 6 by providing a plurality of such paths and switching between the paths when predetermined ESD is detected.

Figure 11:
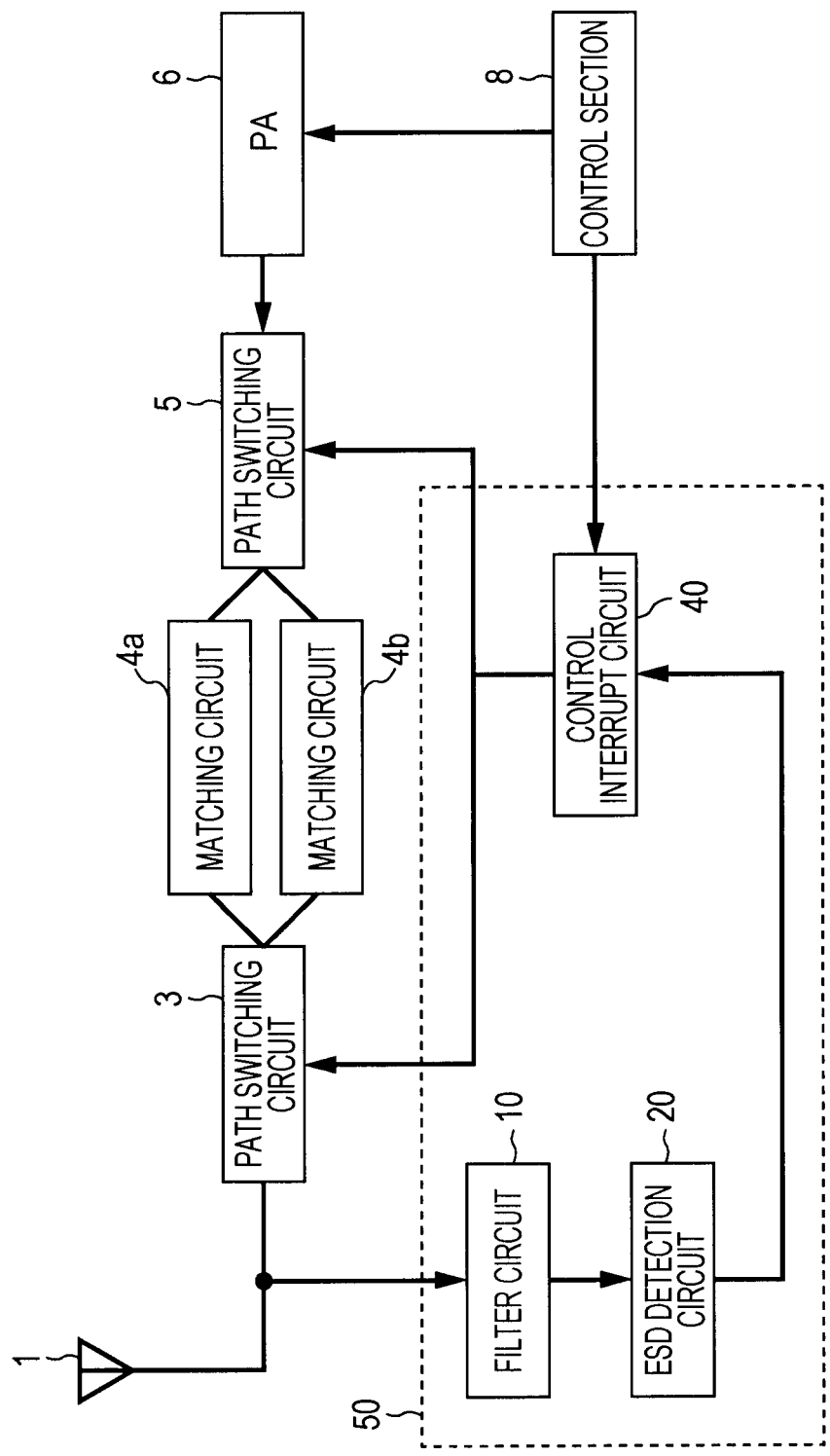
FIG. 11 is a block diagram showing a first exemplary schematic configuration of a portion of a wireless communication apparatus including an ESD protection device according to a second embodiment of the present disclosure.

FIG. 11 shows a first exemplary schematic configuration of a portion of a wireless communication apparatus including an ESD protection device 50a according to the second embodiment of the present disclosure. Elements that are the same as the elements shown in FIG. 1 are denoted by the same reference numerals to omit repeated description.

In the embodiment, a plurality of matching circuits 4a and 4b are provided on the output side of the power amplifier 6, and path switching circuits 3 and 5 that switch between the matching circuits are provided in the stages preceding and following the matching circuits, respectively. The control interrupt circuit 40 switches the path switching circuits 3 and 5 in conjunction with detection of predetermined ESD discussed above. For example, the first matching circuit 4a is used in a normal state, and switching is performed from the first matching circuit 4a to the second matching circuit 4b when predetermined ESD is detected. Thus, the control interrupt circuit 40 controls switching of the path switching circuits 3 and 5 so as to compulsorily reduce the load on the output of the power amplifier 6 when ESD noise is applied to the antenna line 7. This prevents an erroneous operation and a breakage of the power amplifier 6 due to ESD noise.

Figure 12:
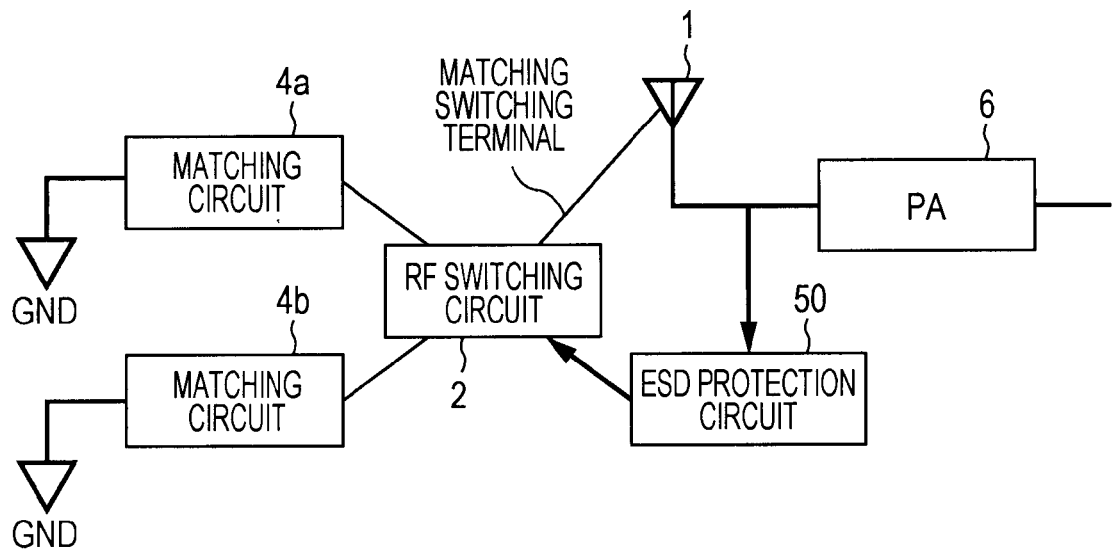
FIG. 12 is a block diagram showing a second example of the second embodiment of the present disclosure.

FIG. 12 shows a second example of the second embodiment. In this example, the first and second matching circuits 4a and 4b and an RF switching circuit 2 that switches between the first and second matching circuits 4a and 4b are provided. The first and second matching circuits 4a and 4b may be formed as circuits with different impedances including various combinations of inductors and capacitors. The first and second matching circuits 4a and 4b are connected by the RF switching circuit 2 such that one of the matching circuits is selectively connected to a matching switching terminal of the antenna 1. Switching of the RF switching circuit 2 is controlled in accordance with the output of the ESD protection device 50 discussed above. The antenna is provided with the matching switching terminal, and an L or a C is connected in the path from the matching switching terminal to GND to change the impedance.

Also according to the second example, the load on the power amplifier 6 can be controlled equivalently. As a result, the adverse effect of ESD on the power amplifier 6 can be mitigated when predetermined ESD is detected.

Figure 13:
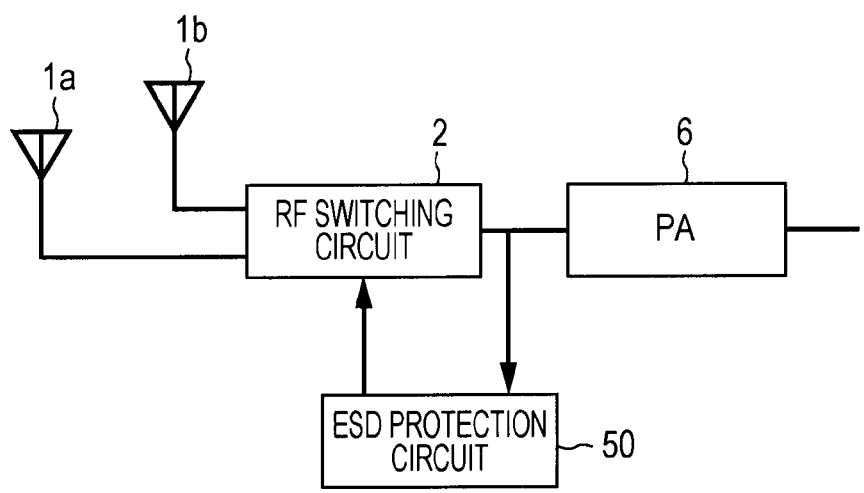
FIG. 13 is a block diagram showing a third example of the second embodiment of the present disclosure.

FIG. 13 shows a third example of the second embodiment. In this example, a plurality of antennas 1a and 1b with different antenna characteristics are provided, and an RF switching circuit 2 that switchably selects one of the antennas is provided. The load impedance on the output side of the power amplifier 6 can be changed by changing the antenna connected to the power amplifier 6 through the ESD protection device 50 when predetermined ESD is detected. This prevents an erroneous operation and a breakage of the power amplifier 6 due to ESD noise.

Figure 14:
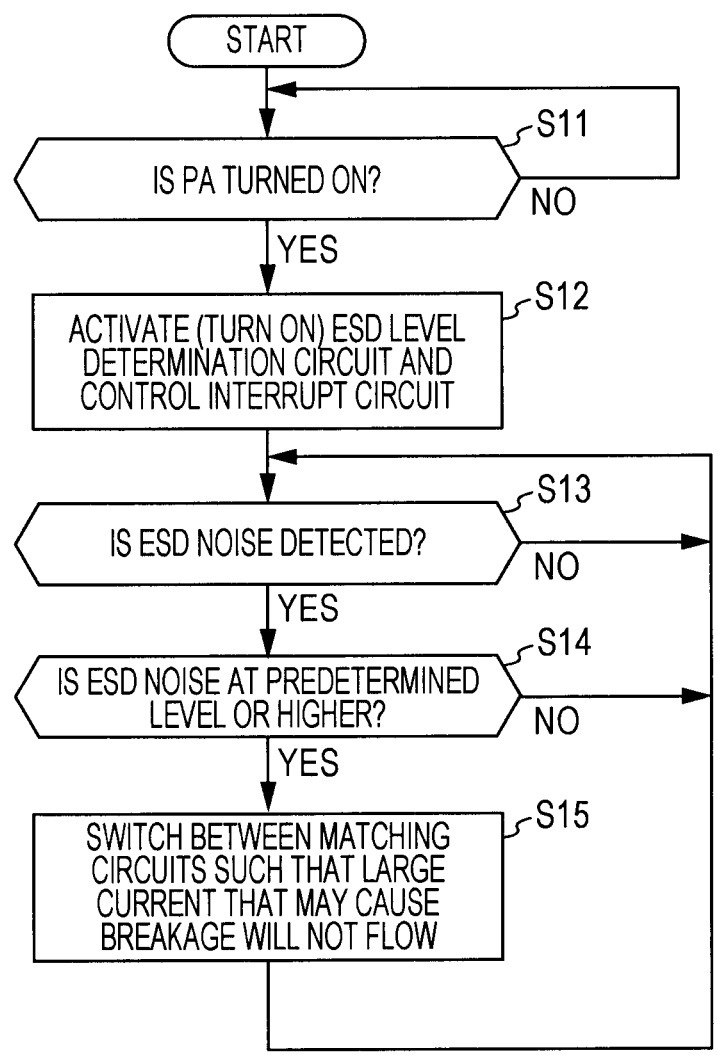
FIG. 14 is a flowchart illustrating a typical operation of the second embodiment of the present disclosure.

The flowchart of FIG. 14 illustrates a typical operation of the second embodiment.

S11: The control section 8 turns ON the power amplifier (PA). In the case where the power amplifier to be protected is not turned ON, the process does not proceed to the subsequent steps. When the operation of the power amplifier is not required, the ESD protection device 50 can be turned OFF to minimize power consumption.

S12: At the same time as the power amplifier 6 to be protected is turned ON, the control section 8 turns ON the ESD level determination circuit 30 and the control interrupt circuit 40.

S13: ESD noise in a such range that may generally occur during normal use of the wireless communication apparatus is applied to the wireless communication apparatus. ESD noise in the assumed range may be generated in the case where a user touches the wireless communication apparatus with the wireless communication apparatus electrically charged, in the case where a user touches the wireless communication apparatus with his/her hand electrically charged, or the like. When ESD noise is detected, electric power corresponding to the voltage of the ESD noise is generated in the antenna line 7. The filter circuit 10 removes electric power from a wireless output that is irrelevant to ESD to extract electric power due to ESD. The ESD detection circuit 20 converts the extracted electric power into an analog DC voltage.

S14: The ESD level determination circuit 30 compares the thus obtained analog DC voltage and a preset reference voltage (threshold value) to check whether the ESD noise is at a predetermined level or higher. The control interrupt circuit 40 is allowed to operate only in the case where the output of the ESD detection circuit 20 is the threshold value or more.

S15: Switching is performed between the matching circuits to indirectly control the power amplifier 6. That is, the output impedance of the power amplifier is changed such that a large current that may break the power amplifier will not flow.

Figure 15:
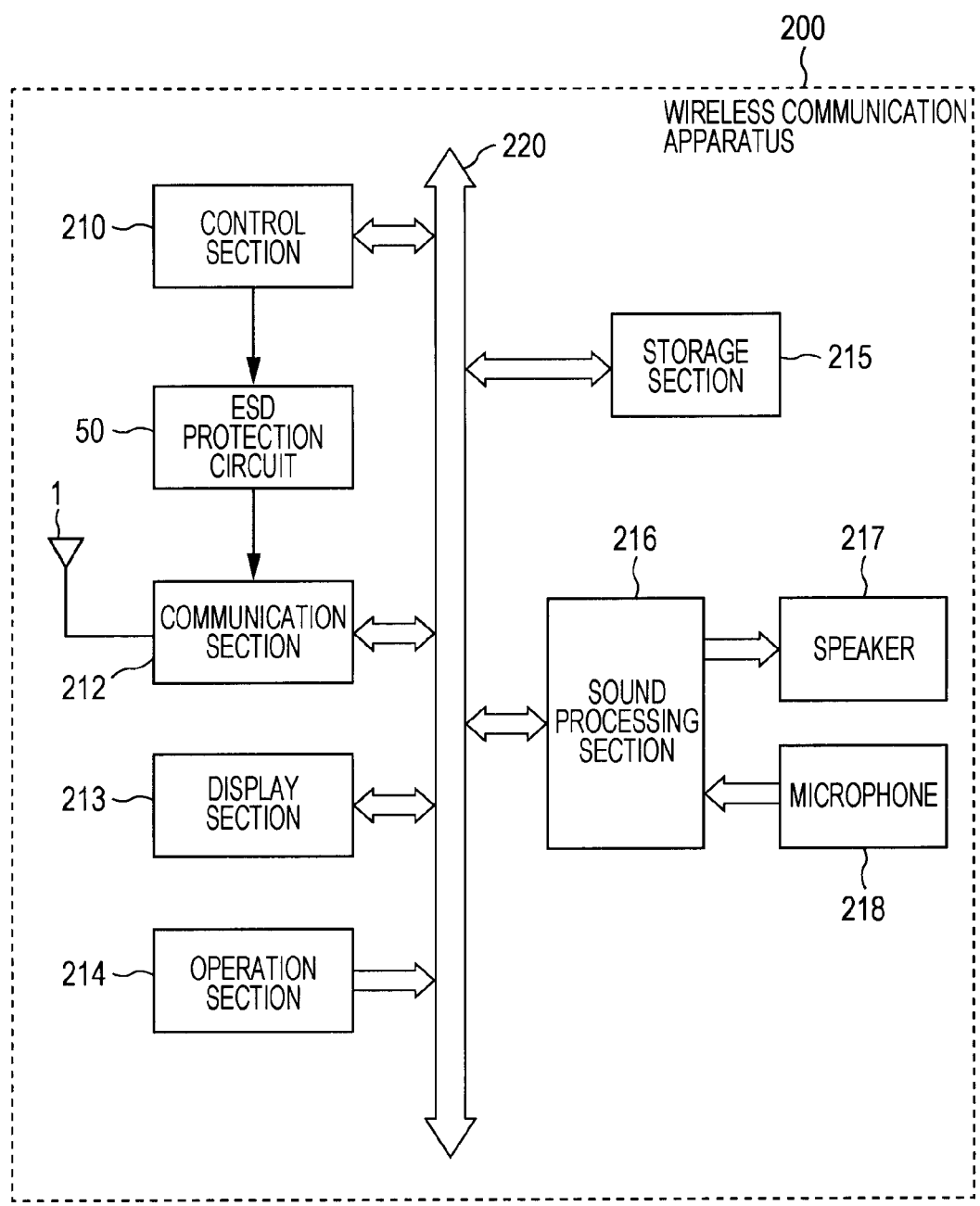
FIG. 15 is a block diagram showing a schematic configuration of a wireless communication apparatus that adopts an ESD protection device according to an embodiment of the present disclosure.

FIG. 15 is a block diagram showing a schematic configuration of a wireless communication apparatus that adopts an ESD protection device according to any of the above embodiments. In this example, the wireless communication apparatus is a cellular phone terminal.

A wireless communication apparatus 200 includes the antenna 1, the protection device 50, a control section 210, a communication section 212, a display section 213, an operation section 214, a storage section 215, a sound processing section 216, a speaker 217, and a microphone 218. The control section 210 corresponds to the control section 8 in FIG. 1.

The control section 210 is connected to the various sections via a bus 220 to control the various sections and perform data processing. The control section 210 includes a processor such as an MPU. The communication section 212 includes the power amplifier 6 shown in FIG. 1. The communication section 212 performs wireless communication with a base station or the like via the antenna 1 by radio waves.

The display section 213 provides a display interface to the user. The display section 213 includes a display device, such as an LCD or an organic EL, that displays information on a display screen. The operation section 214 provides an input interface to the user. The operation section 214 includes an input device such as numeric keys and various control keys. The storage section 215 stores an OS and various application programs, such as a communication application program, as programs to be executed by the control section 210, and data. The storage section 215 includes a memory such as a ROM and a RAM. The sound processing section 216 normally processes sound in a call, sound in a movie file, and music data. The sound processing section 216 may include a codec. The speaker 217 that outputs sound and the microphone 218 that picks up sound to be transmitted are connected to the sound processing section 216.

While preferred embodiments of the present disclosure have been described above, various changes and modifications other than those mentioned above may be made. That is, it should be understood as a matter of course by those skilled in the art that various modifications, combinations, and other embodiments may occur depending on design requirements and other factors insofar as they are within the scope of the appended claims or the equivalents thereof. For example, the specific numerical values of the constant, distance, frequency, dimensions, and so forth of the components described in the specification and shown in the drawings are merely illustrative, and the present disclosure is not limited thereto.

The invention claimed is:

1. An electrostatic discharge (ESD) protection device that protects a power amplifier from ESD, the ESD protection device comprising:
    a filter circuit connected to an antenna line of a wireless communication apparatus and that passes an ESD component having a predetermined frequency or less;
    a detection circuit that converts an output of the filter circuit into an analog DC output;
    a level determination circuit that detects that the analog DC output of the detection circuit is equal to or greater than a predetermined threshold value; and
    a control interrupt circuit that controls a state of at least one of a power supply to the power amplifier and a gain of the power amplifier based on an output of the level determination circuit.

2. The ESD protection device of claim 1, further comprising:
    a control circuit that supplies power to the power amplifier, the level determination circuit and the control interrupt circuit.

3. The ESD protection device of claim 1, wherein the filter circuit blocks a received radio frequency (RF) component.

4. The ESD protection device of claim 1, wherein the detection circuit includes a wave detection circuit that detects both positive and negative outputs of the filter circuit.

5. The ESD protection device of claim 1, wherein the level determination circuit outputs a pulse having a predetermined pulse width and a predetermined logic voltage when it is determined that the analog DC output of the detection circuit is equal to or greater than the predetermined threshold value.

6. The ESD protection device of claim 5, wherein the predetermined pulse width is 600 μsec or less.

7. The ESD protection device of claim 1, wherein the control interrupt circuit interrupts a power supply to the power amplifier when an output of the level determination circuit indicates that the analog DC output of the detection circuit is equal to or greater than the predetermined threshold value.

8. The ESD protection device of claim 1, wherein the power amplifier includes a gain control terminal and the control interrupt circuit controls the gain control terminal to reduce a gain of the power amplifier by a predetermined amount when an output of the level determination circuit indicates that the analog DC output of the detection circuit is equal to or greater than the predetermined threshold value.

9. The ESD protection device of claim 1, wherein the filter circuit is a T-type filter circuit formed by first and second inductors connected in series between the antenna line and the detection circuit, and a third inductor and a capacitor connected in series between a connection point between the first and second inductors and a ground.

10. The ESD protection device of claim 1, wherein the detection circuit includes a first capacitor connected to an output of the filter circuit and an anode of a first diode, a cathode of the first diode being connected to an input of the level determination circuit.

11. The ESD protection device of claim 10, wherein the detection circuit includes a second capacitor connected between a connection point between the first capacitor and the first diode and ground, and a second diode connected in parallel with the second capacitor with an anode of the second diode connected to ground.

12. The ESD protection device of claim 11, wherein the detection circuit includes a third capacitor connected between a cathode of the first diode and ground.

13. The ESD protection device of claim 1, wherein the level determination circuit includes first and second resistors connected between a power supply voltage and ground.

14. The ESD protection device of claim 13, wherein the level determination circuit includes a comparator that compares a reference voltage and a voltage level of the analog DC output of the detection circuit.

15. The ESD protection device of claim 14, wherein the comparator generates an output voltage that varies from a low level to a high level when the voltage level of the analog DC output of the detection circuit exceeds the reference voltage.

16. The ESD protection device of claim 15, wherein the level determination circuit includes a differentiating circuit that detects variations in voltage output from the comparator and outputs a pulse having a predetermined pulse width when the voltage output from the comparator varies from the low level to the high level.

17. The ESD protection device of claim 1, wherein the control interrupt circuit includes a field-effect transistor (FET), and a source of the FET is connected to ground, a drain of the FET is connected to a load resistor and the power amplifier, and a gate of the FET is connected to an output of the level determination circuit.

18. A portable communication terminal including the ESD protection device according to claim 1.

19. A method performed by an electrostatic discharge (ESD) protection device of protecting a power amplifier, the method comprising:
    converting an output of a filter that is connected to an antenna line of a wireless communication apparatus and that passes an ESD component having a predetermined frequency or less into an analog DC output;

detecting that the analog DC output meets or exceeds a predetermined threshold; and controlling a state of at least one of a power supply to the power amplifier and a gain of the power amplifier based on a result of the detecting.

20. An electrostatic discharge (ESD) protection device that protects a power amplifier from ESD, the ESD protection device comprising:

a first path switching circuit connected to an antenna line of a wireless communication apparatus;

a second path switching circuit connected to the power amplifier;

a first matching circuit having a first impedance connected between the first path switching circuit and the power amplifier;

a second matching circuit having a second impedance connected between the first path switching circuit and the power amplifier;

a filter circuit connected to the antenna line and that passes an ESD component having a predetermined frequency or less;

a detection circuit that converts an output of the filter circuit into an analog DC output; and a control interrupt circuit that controls the switching circuits to switch between the first and second matching circuits based on an output of the detection circuit.

* * * * *